US012596305B2

(12) United States Patent
Liu

(10) Patent No.: US 12,596,305 B2
(45) Date of Patent: Apr. 7, 2026

(54) METHOD, APPARATUS AND SYSTEM FOR PROCESSING SEMICONDUCTOR STRUCTURE

(71) Applicant: CHANGXIN MEMORY TECHNOLOGIES, INC., Hefei City (CN)

(72) Inventor: Jing Liu, Hefei (CN)

(73) Assignee: CHANGXIN MEMORY TECHNOLOGIES, INC., Beijing (CN)

( * ) Notice: Subject to any disclaimer, the term of this patent is extended or adjusted under 35 U.S.C. 154(b) by 569 days.

(21) Appl. No.: 18/151,510

(22) Filed: Jan. 9, 2023

(65) Prior Publication Data

US 2024/0027911 A1    Jan. 25, 2024

Related U.S. Application Data

(63) Continuation of application No. PCT/CN2022/109550, filed on Aug. 1, 2022.

(30) Foreign Application Priority Data

Jul. 21, 2022    (CN) ........................ 202210864901.X

(51) Int. Cl.
*G03F 7/16*       (2006.01)
*H01J 37/32*      (2006.01)
(52) U.S. Cl.
CPC .............. *G03F 7/162* (2013.01); *G03F 7/168* (2013.01); *H01J 37/32715* (2013.01);
(Continued)

(58) Field of Classification Search
CPC .... G03F 7/162; G03F 7/168; H01J 37/32715; H01J 37/32743; H01J 2237/20214;
(Continued)

(56) References Cited

U.S. PATENT DOCUMENTS

2005/0014390 A1    1/2005  Li
2005/0280807 A1    12/2005  Backhauss
(Continued)

FOREIGN PATENT DOCUMENTS

CN        1826185 A      8/2006
CN      110391135 A      10/2019
(Continued)

*Primary Examiner* — Caleen O Sullivan
(74) *Attorney, Agent, or Firm* — Syncoda LLC; Feng Ma

(57)            ABSTRACT

The disclosure relates to the technical field of semiconductors, and to a method, apparatus and system for processing a semiconductor structure. The processing method of the disclosure includes: providing a semiconductor substrate; forming a photoresist layer on the semiconductor substrate, the photoresist layer including an edge area and a middle area that are adjacently distributed, the edge area including a protrusion; detecting position information of the protrusion, and determining a target etching area according to the position information, the protrusion being located in the target etching area; and etching the photoresist layer located in the target etching area. By means of the processing method of the disclosure, the maintenance cost of a device can be reduced, and product yield can be improved.

15 Claims, 5 Drawing Sheets

(52) U.S. Cl.
CPC .................... *H01J 37/32743* (2013.01); *H01J 2237/20214* (2013.01); *H01J 2237/24578* (2013.01); *H01J 2237/24585* (2013.01); *H01J 2237/334* (2013.01); *H01J 2237/336* (2013.01)

(58) Field of Classification Search
CPC ... H01J 2237/24578; H01J 2237/24585; H01J 2237/334; H01J 2237/336
USPC ........................................................ 430/311
See application file for complete search history.

(56) References Cited

U.S. PATENT DOCUMENTS

| | | | | |
|---|---|---|---|---|
| 2013/0193564 | A1* | 8/2013 | Liu ..................... | H01L 21/0274 257/E23.179 |
| 2019/0094697 | A1* | 3/2019 | Wang .................. | G03F 7/70775 |
| 2020/0096867 | A1 | 3/2020 | Lattard et al. | |

FOREIGN PATENT DOCUMENTS

| | | | |
|---|---|---|---|
| CN | 110444466 | A | 11/2019 |
| CN | 110568730 | A | 12/2019 |
| CN | 110874018 | A | 3/2020 |
| CN | 110896021 | A | 3/2020 |
| CN | 110941152 | A | 3/2020 |
| EP | 1607738 | A1 | 12/2005 |
| JP | 2018041040 | A | 3/2018 |

* cited by examiner

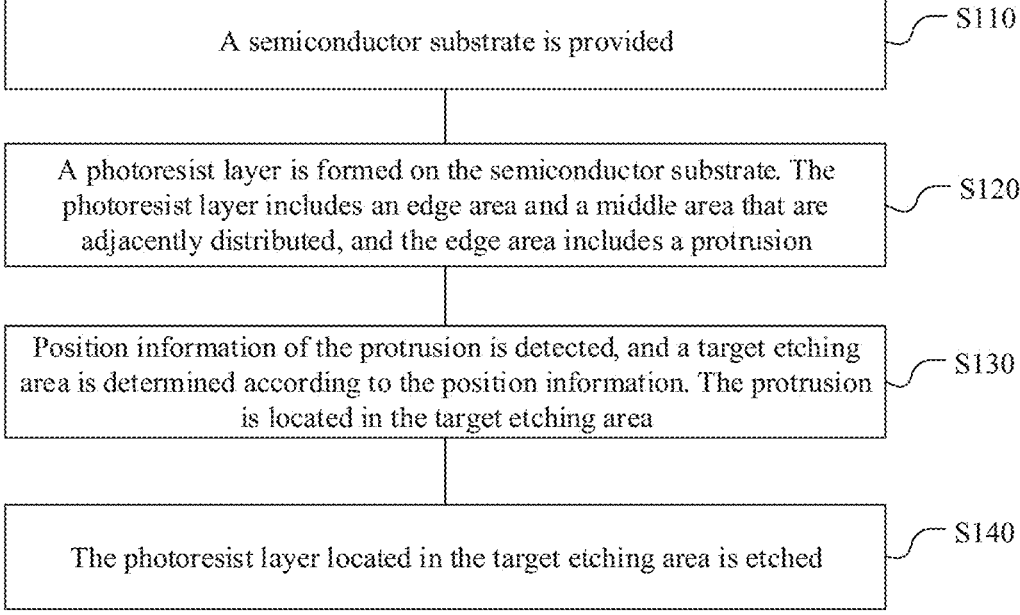

| A semiconductor substrate is provided | S110 |

| A photoresist layer is formed on the semiconductor substrate. The photoresist layer includes an edge area and a middle area that are adjacently distributed, and the edge area includes a protrusion | S120 |

| Position information of the protrusion is detected, and a target etching area is determined according to the position information. The protrusion is located in the target etching area | S130 |

| The photoresist layer located in the target etching area is etched | S140 |

FIG. 1

METHOD, APPARATUS AND SYSTEM FOR PROCESSING SEMICONDUCTOR STRUCTURE

CROSS-REFERENCE TO RELATED APPLICATIONS

This application is a continuation of International Patent Application No. PCT/CN2022/109550, filed on Aug. 1, 2022, which claims priority to Chinese Patent Application No. 202210864901.X, filed on Jul. 21, 2022. The disclosures of International Patent Application No. PCT/CN2022/109550 and Chinese Patent Application No. 202210864901.X are hereby incorporated by reference in their entireties.

TECHNICAL FIELD

The disclosure relates to the technical field of semiconductors, and in particular to a method, apparatus and system for processing a semiconductor structure.

BACKGROUND

A Dynamic Random Access Memory (DRAM) is widely applied to mobile devices such as mobile phones, tablet computers and the like due to its advantages of a small size, a high degree of integration and a fast transmission speed.

A photolithography process is an important process method during the manufacturing of the DRAM. In the method, it is generally necessary to form a photoresist layer on a surface of a semiconductor structure to be etched. However, a protrusion may be often formed at an edge portion of the formed photoresist layer, and the protrusion is easy to fall off after drying, which causes pollution to devices of the follow-up processes, resulting in high device maintenance cost.

It is to be noted that, information disclosed in the above Background section is merely for enhancement of understanding of the background of the disclosure, and may include information that does not constitute the related art that is already known to those of ordinary skill in the art.

SUMMARY

An aspect of the disclosure provides a method for processing a semiconductor structure, which includes: providing a semiconductor substrate; forming a photoresist layer on the semiconductor substrate, the photoresist layer including an edge area and a middle area that are adjacently distributed, the edge area including a protrusion; detecting position information of the protrusion, and determining a target etching area according to the position information, the protrusion being located in the target etching area; and etching the photoresist layer located in the target etching area.

An aspect of the disclosure provides an apparatus for processing a semiconductor structure, which includes: a box body, comprising a vacuum chamber; a spin-coating machine, disposed in the vacuum chamber, and configured to form a photoresist layer on a semiconductor substrate, wherein the photoresist layer comprises an edge area and a middle area that are adjacently distributed, and the edge area comprises a protrusion; a position detection assembly, disposed in the vacuum chamber, and configured to detect position information of the protrusion, and determine a target etching area according to the position information, wherein the protrusion is located in the target etching area; and an etching machine, disposed in the vacuum chamber and electrically connected to the position detection assembly, wherein the etching machine is configured to receive the target etching area that is determined by the position detection assembly, and etch the photoresist layer located in the target etching area.

An aspect of the disclosure provides a system for processing a semiconductor structure, which includes: the apparatus for processing a semiconductor structure described in any one of the above, and a moving apparatus, configured to transport the semiconductor substrate from the spin-coating machine to the etching machine.

It should be understood that, the above general description and the following detailed description are merely exemplary and explanatory, and cannot limit the disclosure.

BRIEF DESCRIPTION OF THE DRAWINGS

Drawings are incorporated into the specification and constitute a part of the specification. The drawings illustrate embodiments in accordance with the disclosure and serve to understand the principles of the disclosure together with the specification. It is apparent that the drawings in the following descriptions are merely some embodiments of the disclosure. Other drawings can be obtained by those skilled in the art according to these drawings without any creative work.

FIG. 1 is a flow chart of a method for processing a semiconductor structure according to an embodiment of the disclosure.

In the drawings:

Figure 2:
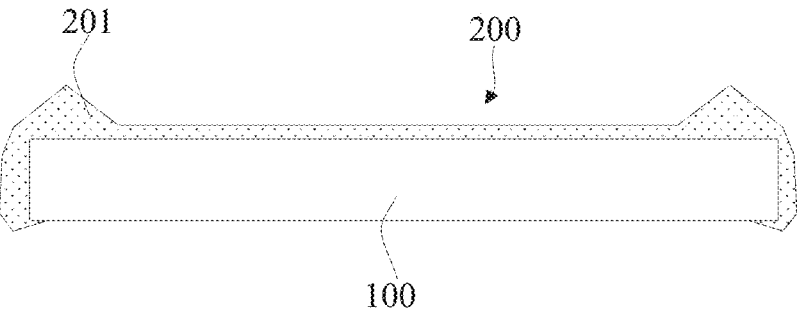
FIG. 2 is a schematic diagram of a photoresist layer according to an embodiment of the disclosure.

100. Semiconductor substrate; 200. Photoresist layer; 201. Protrusion; 1. Bearing platform; 2. Position detection assembly.

DETAILED DESCRIPTION

Exemplary embodiments are described more comprehensively with reference to the drawings. However, exemplary embodiments can be implemented in various forms and should not be construed as limited to the embodiments set forth herein. In contrast, these embodiments are provided for more thorough and complete understanding of the disclosure, and to fully convey the concept of the exemplary embodiments to those skilled in the art. The same reference numerals in the drawings denote same or similar structures, and thus detailed descriptions will be omitted. In addition, the drawings are merely schematic illustrations of the disclosure and are not necessarily drawn to scale.

Although relative terms such as "on/above" and "under/below" are used in this specification to describe a relative relationship of one component in the drawings to another component, these terms are used in this specification only for convenience, for example, according to a direction of the example described in the drawings. It may be understood that, if the apparatus in the drawings is turned upside down, the "above" component described will become the "below" component. When a certain structure is disposed "on" other structures, it may mean that the certain structure is integrally formed on other structures, or that the certain structure is "directly" disposed on other structures, or that the certain structure is "indirectly" disposed on other structures by using another structure.

The terms "a", "an", "the", "said" and "at least one" are used to indicate the presence of one or more elements/components/and the like. The terms "including/comprising" and "having" are used to indicate an open-ended inclusive meaning and mean that additional elements/components/and the like may be present in addition to the listed elements/components/and the like. The terms "first", "second" and the like are merely used as marks and are not intended to limit the number of objects.

During the manufacturing of a DRAM, a semiconductor structure is generally patterned by means of a photolithography process. In this process, photoresist is required to be spin-coated on a surface of the semiconductor structure to be etched. During the spin-coating of the photoresist, the redundant photoresist is pushed to an edge area of the semiconductor structure under the action of centrifugal force. In this process, most photoresist in/of the edge area is thrown off the surface of the semiconductor structure.

However, a portion of the photoresist remains in the edge area of the semiconductor structure. During spin-coating, the relative velocity of the airflow in the edge area of the semiconductor structure is relatively large, so that the photoresist remaining in the edge area is quickly cured to form a protrusion. In the follow-up baking process, the protrusion is easy to fall off, so that a baking tray manipulator and other devices of the follow-up process are polluted.

Currently, the protrusion is usually removed by means of an optical method. For example, the photoresist located in the edge area is exposed and developed (a formed developing area includes an area where the protrusion is located), so as to remove the protrusion. However, when the photoresist is negative photoresist, it is difficult to develop, so that the complete removing of the protrusion is difficult.

Based on this, an embodiment of the disclosure provides a method for processing a semiconductor structure. FIG. 1 is a flow chart of a method for processing a semiconductor structure according to an embodiment of the disclosure. Referring to FIG. 1, the method for processing a semiconductor structure of the disclosure includes S110 to S140.

At S110, a semiconductor substrate is provided.

At S120, a photoresist layer is formed on the semiconductor substrate. The photoresist layer includes an edge area and a middle area that are adjacently distributed, and the edge area includes a protrusion.

At S130, position information of the protrusion is detected, and a target etching area is determined according to the position information. The protrusion is located in the target etching area.

At S140, the photoresist layer located in the target etching area is etched.

According to the method for processing a semiconductor structure, the position information of the protrusion may be obtained by means of detection; the target etching area including the protrusion is determined according to the position information of the protrusion; and all of the photoresist layers in the target etching area are completely removed by means of etching. In this process, the protrusions in the target etching area can be completely etched, so that the protrusions can be prevented from falling off in the follow-up processes to pollute devices, the devices are not required to be cleaned frequently, and the maintenance cost of the devices can be reduced. In addition, the protrusions can also be prevented from falling at other portions of the semiconductor substrate, so that the probability of defects can be reduced, and the discarding of products can be avoided, thereby improving product yield. In addition, secondary uplift cannot be caused by removing the protrusions by means of etching, so that the source of defects in the products can be further reduced, thereby improving the product yield.

Steps and details of the method for processing a semiconductor structure according to the embodiments of the disclosure are described in detail below.

As shown in FIG. 1, at S110, the semiconductor substrate is provided.

The semiconductor substrate may be of a flat-plate structure, which may be in a rectangle, a circle, an ellipse, a polygon, or an irregular shape. A material of the semiconductor substrate may be silicon and/or other semiconductor materials, and the shape and material of the semiconductor substrate are not specifically limited thereto.

In an exemplary embodiment of the disclosure, the semiconductor substrate may be a semiconductor structure before any patterning process. For example, the semiconductor substrate may be a structure prior to etching to form a word line groove. For another example, the semiconductor substrate may be a structure prior to etching to form a capacitor contact hole. Alternatively, the semiconductor substrate may be a structure prior to etching to form a bit line groove. Definitely, the semiconductor structure may also be a structure before other patterning processes, which is not listed herein.

As shown in FIG. 1, at S120, the photoresist layer is formed on the semiconductor substrate. The photoresist layer includes the edge area and the middle area that are adjacently distributed, and the edge area includes the protrusion.

The photoresist layer may be formed on the surface of the semiconductor substrate by spin-coating or other processes, and the process for forming the photoresist layer is not specifically limited herein. A material of the photoresist layer may be photoresist, for example, may be positive photoresist or negative photoresist.

In an exemplary embodiment of the disclosure, the photoresist layer may include a middle area and an edge area. The middle area and the edge area may be distributed adjacently. The middle area may be in a circular, rectangular or irregular shape; and the edge area may be in an annular shape and may surround the middle area. For example, the edge area may be in a ring shape. When the edge area is in the ring shape, the middle area may be circular, and a diameter of the middle area equals an inner diameter of an inner ring of the edge area.

As shown in FIG. 2, the surface of the photoresist of/in the middle area is relatively flat. The edge area is provided with a protrusion 201. A height of the protrusion 201 in a direction perpendicular to the semiconductor substrate 100 is greater than a thickness of the photoresist of the middle area. The protrusion 201 may occupy a small area in the edge area, or may surround the periphery of the middle area with the edge area.

In an exemplary embodiment of the disclosure, the forming the photoresist layer 200 on the semiconductor substrate 100 at S120 may include S210 to S220.

At S210, a surface of the semiconductor substrate 100 is pre-processed, so as to improve the adhesion of the semiconductor substrate 100.

Before the photoresist layer 200 is formed, the surface of the semiconductor substrate 100 may be pre-processed, so as to improve the adhesion of the semiconductor substrate 100, so that the photoresist layer 200 subsequently formed on the surface is tightly attached to the surface of the semiconductor substrate 100. Therefore, the photoresist layer 200 can be better attached to the surface of the semiconductor substrate 100.

For example, a wetting solution may be sprayed on the surface of the semiconductor substrate 100. In this way, the wettability of the surface of the semiconductor substrate 100 is improved by means of the wetting solution, so that the adhesion of the subsequently-formed photoresist layer 200 on the surface of the semiconductor substrate 100 can be improved.

At S220, a spin-coating process is used to form the photoresist layer 200 on the semiconductor substrate 100.

The photoresist layer 200 may be formed on the surface of the semiconductor substrate 100 by means of spin-coating. For example, the semiconductor substrate 100 may be fixed on a rotary table. In a process that the rotary table drives the semiconductor substrate 100 to rotate at a high speed, a raw material of the photoresist is dropped onto the surface of the semiconductor substrate 100. Under the action of rotational centrifugal force, the raw material of the photoresist may be spread on the surface of the semiconductor substrate 100. In this process, the photoresist layer 200 with a relatively uniform thickness may be formed in the middle area of the semiconductor substrate 100. In addition, most photoresist in/of the edge area of the semiconductor substrate 100 is thrown off the surface. However, a portion of the photoresist remains in the edge area of the semiconductor structure 100, so as to form the protrusion 201. An area between a boundary of a photoresist layer and a boundary of the protrusion 201 farthest from the boundary of the photoresist layer is defined as the edge area of the photoresist layer 200. The edge area may be an annular area. The protrusion 201 may be located between an inner ring and an outer ring of the annular area. In addition, an area other than the edge area is defined as the middle area. That is to say, the middle area may be located in the inner ring of the edge area.

It is to be noted that, there may be one or more protrusions 201, which is not specifically limited herein. In some embodiments of the disclosure, there may be one protrusion 201. The protrusion 201 may be in an annular shape, and surrounds the periphery of the middle area. In some other embodiments of the disclosure, there may be a plurality of protrusions 201; and the plurality of protrusions 201 may be distributed in a spaced manner, and may surround the periphery of the middle area in an annular manner.

As shown in FIG. 1, at S130, the position information of the protrusion is detected, the target etching area is determined according to the position information. The protrusion is located in the target etching area.

Figure 3:
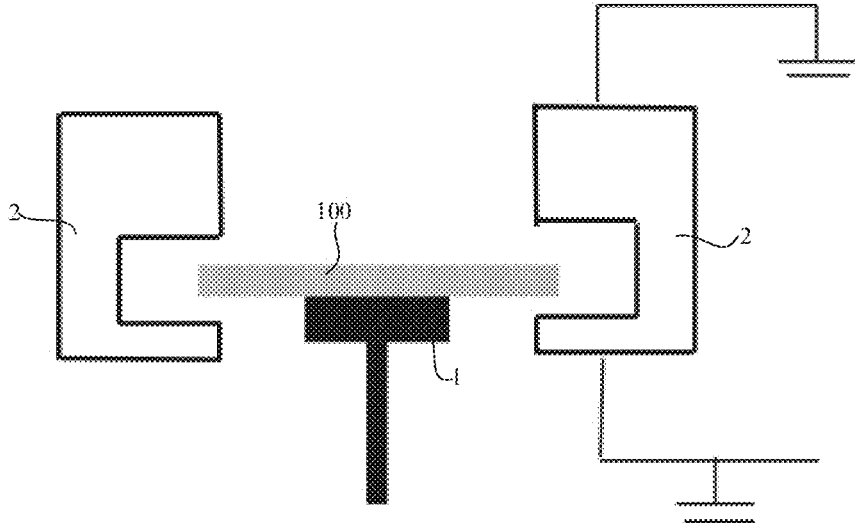
FIG. 3 is a schematic diagram of an etching machine according to an embodiment of the disclosure.
Figure 4:
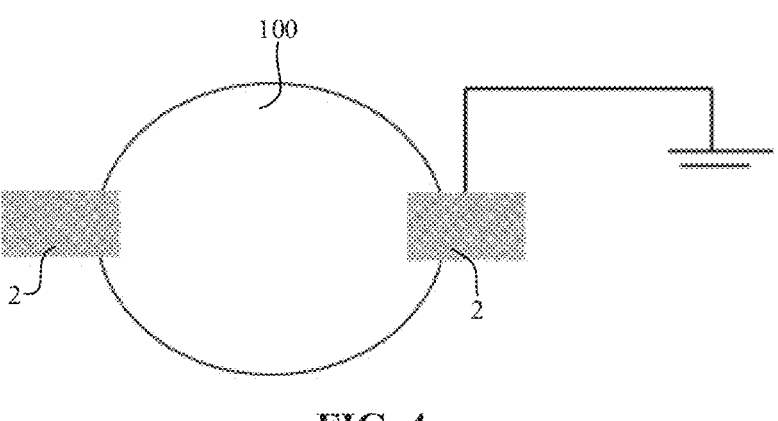
FIG. 4 is a top view of FIG. 3.

In an exemplary embodiment of the disclosure, as shown in FIG. 3 and FIG. 4, a position detection assembly 2 may be used to detect the position information of the protrusion 201, so as to obtain a specific position of the protrusion 201, so that the protrusion 201 can be removed subsequently in a targeted manner. The target etching area may be determined according to the position information of the protrusion 201, so as to achieve targeted etching on the photoresist layer 200 of the target etching area. It is to be noted that, the protrusion 201 may be located in the target etching area, so that the protrusion 201 can be removed subsequently during the etching of the target etching area.

In an exemplary embodiment of the disclosure, the detecting the position information of the protrusion 201 and determining the target etching area in which the protrusion 201 is located according to the position information at S130 may include S310 and S320.

At S310, a boundary of the protrusion 201 close to the middle area is detected.

In some embodiments of the disclosure, the position detection assembly 2 may be disposed on a side of the semiconductor substrate 100 away from the rotary table. For example, the position detection assembly 2 may be located above the semiconductor structure, can be moved from the outside of the semiconductor substrate 100 to the middle area via the edge area, and can detect a thickness of the photoresist layer 200 in/of an area directly opposite to a position where the position detection assembly is located during moving from the outside of the semiconductor substrate 100 to the middle area via the edge area. When the thickness of a certain area is obviously greater than the thicknesses of other areas, it is considered that there is a protrusion 201 in the area, so that the boundary close to the middle area can be determined according to the specific position of the protrusion 201.

For example, when the protrusion 201 is of an annular structure surrounding the periphery of the middle area, a circle may be drawn by using a center point of the photoresist layer 200 as the center of a circle and using a point in the inner ring of the annular protrusion 201 that is closest to the center of the circle as a radius, and a circumferential line of the circle is used as the boundary of the protrusion 201 that is closest to the middle area. When there are a plurality of protrusions 201, a circle may be drawn by using the center point of the photoresist layer 200 as the center of the circle and using a point in the plurality of protrusions 201 that is closest to the center of the circle as a radius, and a circumferential line of the circle is used as the boundary of the protrusion 201 that is closest to the middle area.

In some other exemplary embodiments of the disclosure, the detecting the boundary of the protrusion 201 close to the middle area at S310 may include S3101 and S3102.

At S3101, a change curve is generated according to an actual position of a detection probe of a detection circuit and a thickness of the photoresist layer 200 corresponding to the actual position.

Figure 5:
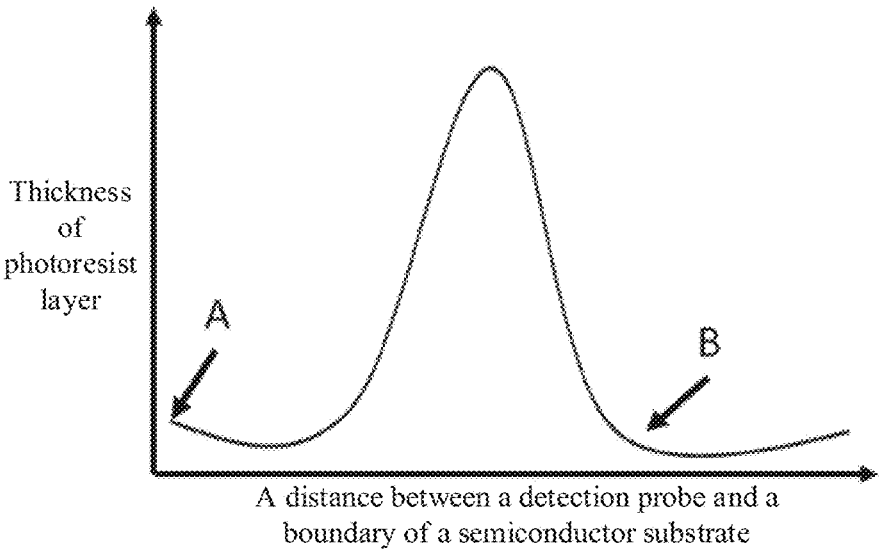
FIG. 5 is a change curve of a thickness of a photoresist layer in a target etching area according to an embodiment of the disclosure.

The position detection assembly 2 may include the detection circuit. The detection circuit may detect the boundary of the protrusion 201 closest to the middle area during moving from the outside of the semiconductor substrate 100 to the middle area via the edge area. For example, the detection circuit may include the detection probe. The detection probe may detect, in real time, the thickness of the photoresist layer 200 of an area directly opposite to an actual position where the detection probe is located during moving from the outside of the semiconductor substrate 100 to the middle area via the edge area, and may generate the change curve of thickness versus position according to the actual position of the detection probe and the thickness of the photoresist layer 200 corresponding to the actual position. The change curve may be shown in FIG. 5. In FIG. 5, A is a boundary of the semiconductor substrate. The position detection assembly starts to move from an edge of the semiconductor substrate to the middle, which may move to at least a flat position B behind a wave crest.

At S3102, according to the change curve, the boundary of the protrusion 201 close to the middle area is determined.

The boundary of the protrusion 201 close to the middle area may be determined according to a change trend of thickness with position in the change curve. For example, if the change curve shows the change trend of increasing first, then decreasing, and remaining unchanged, an initial position of a planarization area after a peak value in the change curve may be used as the boundary of the protrusion 201 close to the middle area. For example, the flat position B in FIG. 5 may be used as the boundary of the protrusion 201 close to the middle area.

At S320, an area that is enclosed by the boundary of the protrusion 201 close to the middle area and a boundary of the edge area away from the middle area is determined as the target etching area.

The target etching area may be enclosed by the boundary of the protrusion 201 close to the middle area and the boundary of the edge area away from the middle area. For example, if the boundary of the protrusion 201 close to the middle area is circular, the target etching area may be an annular area. An inner ring of the annular area may be a ring, and a shape of an outer ring is the same as a shape of the periphery of the photoresist layer 200.

In an exemplary embodiment of the disclosure, there may be a plurality of protrusions 201. Each protrusion 201 may have a corresponding boundary. When the target etching area is determined, a circle may be drawn by using the center point of the photoresist layer 200 as the center of the circle and using a point in the plurality of protrusions 201 that is closest to the center of the circle as a radius, a circumferential line of the circle is used as the boundary of the protrusion 201 that is closest to the middle area, and an area that is enclosed by the circle and the boundary of the edge area away from the middle area is defined as the target etching area.

In addition, when the boundary of the protrusion 201 close to the middle area is an irregular closed shape, a circle may be drawn by using the center point of the photoresist layer 200 as the center of the circle and using a point in the closed shape that is closest to the center of the circle as a radius, a circumferential line of the circle is used as the boundary of the protrusion 201 that is closest to the middle area, and an area that is enclosed by the circle and the boundary of the edge area away from the middle area is defined as the target etching area.

As shown in FIG. 2, at S140, the photoresist layer located in the target etching area is etched.

The photoresist layer 200 located in a target etching area may be removed by means of an etching process. In this process, the protrusions 201 in the target etching area can be completely etched, so that the protrusions 201 can be prevented from falling off in the follow-up processes to pollute devices, the devices are not required to be cleaned frequently, and the maintenance cost of the devices can be reduced. In addition, the protrusions 201 can also be prevented from falling at other portions of the semiconductor substrate 100, so that the probability of defects can be reduced, thereby improving the product yield.

In an exemplary embodiment of the disclosure, a plasma etching process may be used to etch the photoresist layer 200 located in the target etching area. For example, an etching machine may be used to spray an etching gas to the target etching area, so as to form plasma; and then a chemical reaction occurs between the plasma and the material of the photoresist layer 200, so that the photoresist layer 200 located in the target etching area can be removed.

For example, the etching gas may be an oxygen-containing gas, which may be, for example, at least one of oxygen, carbon monoxide, or carbon dioxide. It is to be noted that, in order to prevent the gases from exploding due to reaction, the etching gas may further include an inert gas, which may include, for example, nitrogen, argon, neon, helium, or the like. Definitely, the etching gas may also be other types of gases, as long as the material of the photoresist layer 200 can be removed without damaging the semiconductor substrate 100. For example, the etching gas may also be a mixed gas of the hydrogen and the nitrogen, and the type of the etching gas is not specifically limited herein.

In an exemplary embodiment of the disclosure, the method for processing a semiconductor structure may further include as follows.

At S150, a material of the photoresist layer 200 located on a sidewall and a back surface of the semiconductor substrate 100 is removed.

The material of the photoresist layer 200 located on the sidewall and the back surface of the semiconductor substrate 100 may be removed by means of the etching or ashing process, so as to prevent the material of the photoresist layer 200 located on the sidewall and the back surface of the semiconductor substrate 100 from polluting devices due to the falling-off in the follow-up process, so that the maintenance cost of the devices can be further reduced. In addition, the material of the photoresist layer 200 located on the sidewall and the back surface of the semiconductor substrate 100 can be prevented from falling at other portions of the semiconductor substrate 100, so that the probability of defects can be further reduced, thereby improving the product yield.

In some embodiments of the disclosure, the material of the photoresist layer 200 located on the sidewall and the back surface of the semiconductor substrate 100 may be removed by means of the etching process. For example, the etching machine may be used to spray the etching gas on the sidewall and the back surface of the semiconductor substrate 100, so as to form the plasma; and then, a chemical reaction occurs between the plasma and the material of the photoresist layer 200 located on the sidewall and the back surface of the semiconductor substrate 100, so that the material of the photoresist layer 200 located on the sidewall and the back surface of the semiconductor substrate 100 can be removed.

In some other embodiments of the disclosure, when the photoresist layer 200 of the target etching area is etched, the plasma may be diffused locally. For example, the plasma may be diffused to the sidewall and the back surface of the semiconductor substrate 100, so that material of the photoresist layer 200 located on the sidewall and the back surface of the semiconductor substrate 100 can be removed together.

It is to be noted that, although the various steps of the method for processing a semiconductor structure in the disclosure are described in a particular order in the drawings, this does not require or imply that the steps must be performed in the particular order, or that all shown steps must be performed to achieve desired results. Additionally or alternatively, certain steps may be omitted, a plurality of steps may be combined into one step for execution, and/or one step may be decomposed into a plurality steps for execution, and the like.

An embodiment of the disclosure further provides an apparatus for processing a semiconductor structure. The processing apparatus may include a box body, a spin-coating machine, a position detection assembly 2 and an etching machine.

The box body may include a vacuum chamber.

The spin-coating machine may be disposed in the vacuum chamber, and configured to form a photoresist layer 200 on a semiconductor substrate 100. The photoresist layer 200 includes an edge area and a middle area that are adjacently distributed. The edge area includes a protrusion 201.

The position detection assembly 2 may be disposed in the vacuum chamber, and configured to detect position information of the protrusion 201, and determine a target etching area according to the position information. The protrusion 201 is located in the target etching area.

The etching machine may be disposed in the vacuum chamber and electrically connected to the position detection assembly 2. The etching machine is configured to receive the target etching area that is determined by the position detection assembly 2, and etch the photoresist layer 200 located in the target etching area.

According to the apparatus for processing a semiconductor structure, the position information of the protrusion 201 may be obtained by means of detection; then, the target etching area including the protrusion 201 is determined according to the position information of the protrusion 201; and all of the photoresist layers 200 in the target etching area are completely removed by means of etching. In this process, the protrusions 201 in the target etching area can be completely etched, so that the protrusions 201 can be prevented from falling off in the follow-up processes to pollute devices, the devices are not required to be cleaned frequently, and the maintenance cost of the devices can be reduced. In addition, the protrusions 201 can also be prevented from falling at other portions of the semiconductor substrate 100, so that the probability of defects can be reduced, and the discarding of products can be avoided, thereby improving product yield. In addition, secondary uplift cannot be caused by removing the protrusions 201 by means of etching, so that the source of defects in the products can be further reduced, thereby improving the product yield.

Portions of the apparatus for processing a semiconductor structure of the disclosure are described in detail below.

In an exemplary embodiment of the disclosure, the semiconductor structure may include at least the semiconductor substrate 100. The semiconductor substrate 100 may be of a flat-plate structure, which may be in a rectangle, a circle, an ellipse, a polygon, or an irregular shape. A material of the semiconductor substrate may be silicon and/or other semiconductor materials, and the shape and material of the semiconductor substrate 100 are not specifically limited thereto.

In an exemplary embodiment of the disclosure, the semiconductor substrate 100 may be a semiconductor structure before any patterning process. For example, the semiconductor substrate may be a structure prior to etching to form a word line groove. For another example, the semiconductor substrate may be a structure prior to etching to form a capacitor contact hole. Alternatively, the semiconductor substrate may be a structure prior to etching to form a bit line groove. Definitely, the semiconductor structure may also be a structure before other patterning processes, which is not listed herein.

The box body may be in the form of a polyhedron or a cylinder, and definitely, may also be other shapes, and the shape of the box body is not specifically limited herein. In addition, a material of the box body may be organic glass, a stainless steel material or a metal material, and definitely, may also be other materials. For example, the material may also be an alloy material. The specific material of the box body is not specifically limited herein.

The spin-coating machine may be disposed in the box body. The photoresist layer 200 may be formed on the semiconductor substrate 100 by means of the spin-coating machine. A material of the photoresist layer 200 may be photoresist, for example, may be positive photoresist or negative photoresist.

In an exemplary embodiment of the disclosure, the photoresist layer 200 may include a middle area and an edge area. The middle area and the edge area may be distributed adjacently. The middle area may be in a circular, rectangular or irregular shape; and the edge area may be in an annular shape and may surround the middle area. For example, the edge area may be in a ring shape. When the edge area is in the ring shape, the middle area may be circular, and a diameter of the middle area equals an inner diameter of an inner ring of the edge area.

As shown in FIG. 2, the surface of the photoresist of the middle area is relatively flat. The edge area is provided with a protrusion 201. A height of the protrusion 201 in a direction perpendicular to the semiconductor substrate 100 is greater than a thickness of the photoresist of the middle area. The protrusion 201 may occupy a small area in the edge area, or may surround the periphery of the middle area with the edge area.

For example, the spin-coating machine may include a rotary table and a dropper.

The rotary table may have a table surface. The table surface may be a plane. The plane is disposed parallel to a horizontal plane. The semiconductor substrate 100 may be placed on the rotary table (that is, the rotary table may be used to carry/bear the semiconductor substrate 100), and may be fixedly connected to the rotary table, so that the semiconductor substrate 100 can be prevented from falling off the rotary table during the formation of the photoresist layer 200 by means of spin-coating. For example, a surface of the rotary table may be provided with an opening, and a vacuum channel may be disposed in the rotary table. One end of the vacuum channel is connected to the opening, and the other end is connected to a vacuum pump. When the semiconductor substrate 100 is placed on the rotary table, the semiconductor substrate may cover the opening on the rotary table. Vacuum pumping may be performed by using the vacuum pump, so that the semiconductor substrate 100 is sucked on the rotary table. Therefore, the fixation between the semiconductor substrate 100 and the rotary table by means of bonding or clamping can be prevented from damaging an internal structure of the semiconductor substrate 100, thereby improving the product yield. Preferably, the opening may be located in the center of the rotary table, so that the semiconductor substrate 100 can be fixed in the center position of the rotary table. In this way, the photoresist layer 200 with low roughness (a thickness of a thin film being relatively uniform) can be formed subsequently on the surface of the semiconductor substrate 100. The rotary table may be connected to a motor. During the spin-coating of the photoresist layer 200, under the driving of the motor, the rotary table may drive the semiconductor substrate 100 to rotate, so that the material for forming the photoresist layer 200 is spread on the surface of the semiconductor substrate 100.

The dropper may be in a tubular shape. A cross section of the dropper may be in a circle, an ellipse, a polygon, a rectangle or an irregular shape. A material of the dropper may be rubber, plastic, metal tubes, alloy, or the like. The shape and material of the dropper are not specifically limited herein.

The dropper may be disposed in the vacuum chamber, and may include an opening. The opening may be disposed opposite to the rotary table. The material for forming the photoresist layer 200 may be dropped on the surface of the semiconductor substrate 100 by means of the dropper in the process that the rotary table drives the semiconductor substrate 100 to rotate. Under the action of centrifugal force during the rotating of the rotary table, the material for forming the photoresist layer 200 may be uniformly coated in the middle area of the semiconductor substrate 100, and the redundant material is thrown off to the edge area of the semiconductor substrate 100. In this process, since the relative velocity of the airflow in the edge area is relatively large, so that partial material remaining in the edge area is easy to cure, so as to form a protrusion 201. It is to be noted that, when the rotary table is stationary, the material for forming the photoresist layer 200 may be dropped on the surface of the semiconductor substrate 100; and then the semiconductor substrate 100 is driven to rotate by means of the rotary table, so as to form the photoresist layer 200.

In an exemplary embodiment of the disclosure, the spin-coating machine may further include a first spray nozzle. The first spray nozzle may be disposed opposite to the rotary table, and may be configured to spray a wetting material on the surface of the semiconductor substrate 100 before the material of the photoresist layer 200 is dropped on the surface of the semiconductor substrate 100, so as to improve the adhesion of the surface of the semiconductor substrate 100, so that the photoresist layer 200 subsequently formed on the surface is tightly attached to the surface of the semiconductor substrate 100. Therefore, the photoresist layer 200 can be better attached to the surface of the semiconductor substrate 100.

The first spray nozzle may be in a circle, a rectangle, a polygon, or other shape, and the shape of the first spray nozzle is not specifically limited herein. A wetting solution may be sprayed on the surface of the semiconductor substrate 100 by means of the first spray nozzle. In this way, the wettability of the surface of the semiconductor substrate 100 is improved by means of the wetting solution, so that the adhesion of the subsequently-formed photoresist layer 200 on the surface of the semiconductor substrate 100 can be improved.

The position detection assembly 2 may be disposed on a side of the semiconductor substrate 100 away from the rotary table. For example, the position detection assembly 2 may be located above the semiconductor substrate 100, can be moved from the outside of the semiconductor substrate 100 to the middle area via the edge area, and can detect a thickness of the photoresist layer 200 in/of an area directly opposite to a position where the position detection assembly is located during moving from the outside of the semiconductor substrate 100 to the middle area via the edge area. When the thickness of a certain area is obviously greater than the thicknesses of other areas, it is considered that there is a protrusion 201 in the area, so that the boundary close to the middle area can be determined according to the specific position of the protrusion 201.

For example, when the protrusion 201 is of an annular structure surrounding the periphery of the middle area, a circle may be drawn by using a center point of the photoresist layer 200 as the center of a circle and using a point in an inner ring of the annular protrusion 201 that is closest to the center of the circle as a radius, and a circumferential line of the circle is used as the boundary of the protrusion 201 that is closest to the middle area. When there are a plurality of protrusions 201, a circle may be drawn by using the center point of the photoresist layer 200 as the center of the circle and using a point in the plurality of protrusions 201 that is closest to the center of the circle as a radius, and a circumferential line of the circle is used as the boundary of the protrusion 201 that is closest to the middle area.

In an exemplary embodiment of the disclosure, the position detection assembly 2 may include a detection circuit and an area determination module.

The detection circuit may detect the boundary of the protrusion 201 closest to the middle area during moving from the outside of the semiconductor substrate 100 to the middle area via the edge area. For example, the detection circuit may include the detection probe. The detection probe may detect, in real time, the thickness of the photoresist layer 200 of an area directly opposite to an actual position where the detection probe is located during moving from the outside of the semiconductor substrate 100 to the middle area via the edge area.

The area determination module may determine an area that is enclosed by the boundary of the protrusion 201 close to the middle area and a boundary of the edge area away from the middle area as the target etching area. That is to say, the target etching area may be enclosed by the boundary of the protrusion 201 close to the middle area and the boundary of the edge area away from the middle area. For example, if the boundary of the protrusion 201 close to the middle area is circular, the target etching area may be an annular area. An inner ring of the annular area may be a ring, and a shape of an outer ring is the same as a shape of the periphery of the photoresist layer 200.

In an exemplary embodiment of the disclosure, there may be a plurality of protrusions 201. Each protrusion 201 may have a corresponding boundary. When the target etching area is determined, a circle may be drawn by using the center point of the photoresist layer 200 as the center of the circle and using a point in the plurality of protrusions 201 that is closest to the center of the circle as a radius, a circumferential line of the circle is used as the boundary of the protrusion 201 that is closest to the middle area, and an area that is enclosed by the circle and the boundary of the edge area away from the middle area is defined as the target etching area.

In addition, when the boundary of the protrusion 201 close to the middle area is an irregular closed shape, a circle may be drawn by using the center point of the photoresist layer 200 as the center of the circle and using a point in the closed shape that is closest to the center of the circle as a radius, a circumferential line of the circle is used as the boundary of the protrusion 201 that is closest to the middle area, and an area that is enclosed by the circle and the boundary of the edge area away from the middle area is defined as the target etching area.

In an exemplary embodiment of the disclosure, the position detection assembly may further include a curve generation module and a boundary determination module.

The curve generation module may generate a change curve of thickness versus position according to the actual position of the detection probe and the thickness of the photoresist layer 200 corresponding to the actual position. The change curve may be shown in FIG. 5. In FIG. 5, A is a boundary of the semiconductor substrate. The position detection assembly starts to move from an edge of the semiconductor substrate to the middle, which may move to at least a flat position B behind a wave crest. The boundary determination module may determine the boundary of the protrusion 201 close to the middle area according to a change trend of thickness with position in the change curve. For example, if the change curve shows the change trend of increasing first, then decreasing, and remaining unchanged, an initial position of a planarization area after a peak value in the change curve may be used as the boundary of the protrusion 201 close to the middle area. For example, the flat position B in FIG. 5 may be used as the boundary of the protrusion 201 close to the middle area.

For example, the position detection assembly 2 may be a thickness sensor.

The etching machine may be disposed in the vacuum chamber, and may be configured to etch the photoresist layer 200 located in the target etching area, so as to remove the protrusion 201. In this process, secondary uplift of the photoresist layer 200 cannot be caused, so that defects can be further reduced, thereby improving the product yield. For example, the spin-coating machine may be electrically connected to the position detection assembly 2. The etching machine may receive the target etching area that is determined by the position detection assembly 2, and etch the photoresist layer 200 located in the target etching area.

In an exemplary embodiment of the disclosure, as shown in FIG. 3 and FIG. 4, the etching machine may include a bearing platform 1, a second spray nozzle and a control assembly.

The bearing platform 1 may have a bearing surface. The bearing surface may be a plane, and the plane is disposed parallel to a horizontal plane. The semiconductor substrate 100 having the photoresist layer 200 may be fixed on the bearing platform 1 (that is, the bearing platform 1 may be configured to bear the semiconductor substrate 100 having the photoresist layer 200), and may be fixedly connected to the bearing platform 1, so that the semiconductor substrate 100 can be prevented from falling off the bearing platform 1 during the etching of the photoresist layer 200. For example, the fixation mode between the bearing platform 1 and the semiconductor substrate 100 is similar to the fixation mode between the rotary table and the semiconductor substrate 100. Therefore, details are not described herein again. The bearing platform 1 may be connected to a motor. During the etching of the photoresist layer 200, the bearing platform 1 may drive the semiconductor substrate 100 to rotate under the driving of the motor, so as to completely remove the photoresist layer 200 in the annular target etching area. Therefore, residues in some areas can be avoided.

The second spray nozzle may be disposed opposite to the bearing platform 1, and may be configured to spray an etching gas to the semiconductor substrate 100 having the photoresist layer 200, so as to form plasma; and then a chemical reaction occurs between the plasma and the material of the photoresist layer 200, so that the photoresist layer 200 located in the target etching area can be removed.

For example, the etching gas may be an oxygen-containing gas, which may be, for example, at least one of oxygen, carbon monoxide, or carbon dioxide. It is to be noted that, in order to prevent the gases from exploding due to reaction, the etching gas may further include an inert gas, which may include, for example, nitrogen, argon, neon, helium, or the like. Definitely, the etching gas may also be other types of gases, as long as the material of the photoresist layer 200 can be removed without damaging the semiconductor substrate 100. For example, the etching gas may also be a mixed gas of the hydrogen and the nitrogen, and the type of the etching gas is not specifically limited herein.

In some embodiments of the disclosure, the second spray nozzle may be in a tubular shape. A cross section of the second spray nozzle may be in a circle, an ellipse, a polygon, a rectangle or an irregular shape. A material of the second spray nozzle may be rubber, plastic, metal tubes, alloy, or the like. The shape and material of the second spray nozzle are not specifically limited herein.

The control assembly may be electrically connected to the position detection assembly 2. For example, the control assembly may be connected to the position detection assembly 2 in a conductive manner. The control assembly may be configured to receive the target etching area that is determined by the position detection assembly 2 and control the second spray nozzle to spray an etching gas to the target etching area.

For example, the control assembly may control the second spray nozzle to move according to the target etching area, so as to control the distance between the second spray nozzle and an edge of the semiconductor substrate 100. For example, the control assembly may control the orthographic projection of the second spray nozzle on the semiconductor substrate 100 to cover the edge of the semiconductor substrate 100. When the orthographic projection of the second spray nozzle on the semiconductor substrate 100 covers the edge of the semiconductor substrate 100, the control assembly may control the second spray nozzle to slowly move from the edge of the semiconductor substrate 100 to the boundary of the target etching area close to the middle area, and simultaneously spray the etching gas on the surface of the semiconductor substrate 100 during moving, so that the photoresist layer 200 of the target etching area can be etched.

For example, the control assembly may be a set computer program or a controller. Definitely, the control assembly may also be other apparatuses or devices that may implement control functions, which is not listed herein.

In an exemplary embodiment of the disclosure, the system for processing a semiconductor structure of the disclosure may further include a gas concentration detection assembly. The gas concentration detection assembly may extend into the vacuum chamber. A gas concentration in the vacuum chamber may be detected by means of the gas concentration detection assembly. In addition, when the gas concentration is less than a preset value, it may be determined that the photoresist layer 200 of the target etching area is etched completely. Therefore, the semiconductor substrate 100 having the photoresist layer 200 can be sent out.

In some embodiments of the disclosure, the gas concentration detection assembly may include a gas concentration detection probe. The gas concentration detection probe may extend into the vacuum chamber. The gas concentration in the vacuum chamber may be detected by means of the gas concentration detection probe. When the detected gas concentration is less than the preset value, it may be determined that the photoresist layer 200 of the target etching area is completely etched, so as to determine that the protrusion 201 is completely removed.

For example, the gas concentration detection assembly may be a gas concentration sensor.

An embodiment of the disclosure further provides a system for processing a semiconductor structure. The processing system may include the apparatus for processing a semiconductor structure described in any one of the above embodiments and a moving apparatus. The moving apparatus may be configured to transport a semiconductor substrate 100 from a spin-coating machine to an etching machine. For example, the moving apparatus may be a robot that transports the semiconductor substrate 100 during the manufacturing of a semiconductor.

The details and beneficial effects of the system for processing a semiconductor structure of the disclosure have been described in detail in the embodiments of the method for processing a semiconductor substrate and the apparatus for processing a semiconductor substrate. Therefore, details are not described herein again.

In some embodiments of the disclosure, the moving apparatus may be provided with a fixed sliding track, so that the moving apparatus may move back and forth along the sliding track. For example, the sliding track may be disposed in the vacuum chamber, and may be located at least between the spin-coating machine and the etching machine. The moving apparatus may transport the semiconductor substrate 100 having the photoresist layer 200 after the spin-coating of the spin-coating machine to the etching machine via the sliding track.

In some embodiments of the disclosure, the sliding track may be in a strip-like shape, and may be fixed in the vacuum chamber. The sliding track may be a linear track, or may be a track that has a radian in an extending direction. For example, the sliding track may be an S-shaped or U-shaped track. The type of the sliding track is not specifically limited herein.

It is to be noted that, the moving apparatus may further be configured to transport the semiconductor substrate 100 from an inlet of the vacuum chamber to the spin-coating machine, or send out the semiconductor substrate 100 having the photoresist layer 200 after etching.

An operation process of the system for processing a semiconductor structure of the disclosure is briefly described below.

A semiconductor substrate 100 may be transported from the inlet of the vacuum chamber to the rotary table of the spin-coating machine by means of the moving apparatus. The internal of the rotary table is vacuumed by using a mechanical pump, to suck the semiconductor substrate 100 onto the rotary table, so as to prevent the semiconductor substrate 100 from throwing off in the follow-up rotation process. A first spray nozzle is used to spray a wetting material on a surface of the semiconductor substrate 100, so as to improve the adhesion of the semiconductor substrate 100, so that the photoresist layer 200 subsequently formed on the surface can be better attached to the semiconductor substrate 100. The semiconductor substrate 100 is driven to rotate by means of the rotary table. During rotation, photoresist is dropped onto the surface of the semiconductor substrate 100 by means of the dropper, so that a photoresist layer 200 can be formed on the surface of the semiconductor substrate 100. Then, the semiconductor substrate 100 on which the photoresist layer 200 is formed is transported to the bearing platform 1 of the etching machine by means of the moving apparatus. The position detection assembly 2 is used to detect the surface of the photoresist layer 200 so as to determine a target etching area including a protrusion 201, and transmit a specific position of the etching area to the control assembly. The control assembly may control the orthographic projection of the second spray nozzle on the semiconductor substrate 100 to cover the edge of the semiconductor substrate 100. When the orthographic projection of the second spray nozzle on the semiconductor substrate 100 covers the edge of the semiconductor substrate 100, the control assembly may control the second spray nozzle to slowly move from the edge of the semiconductor substrate 100 to the boundary of the target etching area close to the middle area, and simultaneously spray an etching gas on the surface of the semiconductor substrate 100 during moving, so that the photoresist layer 200 of the target etching area including the protrusion 201 can be etched. In the above process, the gas concentration detection assembly may extend into the vacuum chamber. A gas concentration in the vacuum chamber may be detected by means of the gas concentration detection assembly, and when the gas concentration is less than a preset value, it is determined that the photoresist layer 200 of the target etching area is etched completely. Finally, the semiconductor substrate 100 having the photoresist layer 200 can be sent out by means of the moving apparatus. In this process, the protrusions 201 in the target etching area can be completely etched, so that the protrusions 201 can be prevented from falling off in the follow-up processes to pollute devices, the devices are not required to be cleaned frequently, and the maintenance cost of the devices can be reduced. In addition, the protrusions 201 can also be prevented from falling at other portions of the semiconductor substrate 100, so that the probability of defects can be reduced, thereby improving the product yield.

Other embodiment solutions of the disclosure will readily occur to those skilled in the art upon consideration of the specification and practice of the invention disclosed herein. The disclosure is intended to cover any variations, uses, or adaptations of the disclosure that follow the general principles of the disclosure and include common knowledge or techniques in the technical field that are not disclosed by the disclosure. The specification and examples are to be regarded as exemplary only, with the true scope and spirit of the disclosure being indicated by the appended claims.

The invention claimed is:

1. A method for processing a semiconductor structure, comprising:

providing a semiconductor substrate;

forming a photoresist layer on the semiconductor substrate, the photoresist layer comprising an edge area and a middle area that are adjacently distributed, the edge area comprising a protrusion;

generating a change curve according to an actual position of a detection probe of a detection circuit and a thickness of the photoresist layer corresponding to the actual position;

determining the boundary of the protrusion close to the middle area according to the change curve;

determining an area that is enclosed by the boundary of the protrusion close to the middle area and a boundary of the edge area away from the middle area as a target etching area; and etching the photoresist layer located in the target etching area.

2. The method for processing of claim 1, wherein the determining the boundary of the protrusion close to the middle area according to the change curve comprises:

using an initial position of a planarization area after a peak value in the change curve as the boundary of the protrusion close to the middle area.

3. The method for processing of claim 1, wherein the etching the photoresist layer located in the target etching area comprises:

using a plasma etching process to etch the photoresist layer located in the target etching area.

4. The method for processing of claim 1, wherein the forming a photoresist layer on the semiconductor substrate comprises:

pre-processing a surface of the semiconductor substrate to improve adhesion of the semiconductor substrate; and using a spin-coating process to form the photoresist layer on the semiconductor substrate.

5. The method for processing of claim 4, further comprising:

removing a material of the photoresist layer located on a sidewall and a back surface of the semiconductor substrate.

6. An apparatus for processing a semiconductor structure, comprising:

a box body, comprising a vacuum chamber;

a spin-coating machine, disposed in the vacuum chamber, and configured to form a photoresist layer on a semiconductor substrate, wherein the photoresist layer comprises an edge area and a middle area that are adjacently distributed, and the edge area comprises a protrusion; wherein the spin-coating machine comprises a rotary table, configured to bear the semiconductor substrate, and drive the semiconductor substrate to rotate;

a position detection assembly, disposed in the vacuum chamber, and configured to detect position information of the protrusion, and determine a target etching area according to the position information, wherein the protrusion is located in the target etching area;

an etching machine, disposed in the vacuum chamber and electrically connected to the position detection assembly, wherein the etching machine is configured to receive the target etching area that is determined by the position detection assembly, and etch the photoresist layer located in the target etching area;

wherein the position detection assembly is located on a side of the semiconductor substrate away from the rotary table, and is moved from outside of the semiconductor substrate to the middle area via the edge area;

the position detection assembly comprises:

a detection circuit, configured to detect a boundary of the protrusion close to the middle area during moving from the outside of the semiconductor substrate to the middle area via the edge area; and an area determination module, configured to determine the target etching area according to the boundary of the protrusion close to the middle area and a boundary of the edge area away from the middle area;

a curve generation module, configured to generate a change curve according to an actual position of a detection probe of the detection circuit and a thickness of the photoresist layer corresponding to the actual position; and a boundary determination module, configured to determine the boundary of the protrusion close to the middle area according to the change curve.

7. The apparatus for processing of claim 6, wherein the spin-coating machine comprises:

a dropper, disposed in the vacuum chamber, wherein an opening of the dropper is disposed opposite to the rotary table, and the dropper is configured to drop a material of the photoresist layer onto a surface of the semiconductor substrate.

8. The apparatus for processing of claim 7, wherein the spin-coating machine further comprises:

a first spray nozzle, disposed opposite to the rotary table, and configured to spray a wetting material on the surface of the semiconductor substrate before the material of the photoresist layer is dropped onto the surface of the semiconductor substrate to improve adhesion of the surface of the semiconductor substrate.

9. The apparatus for processing of claim 6, wherein the boundary determination module is configured to use an initial position of a planarization area after a peak value in the change curve as the boundary of the protrusion close to the middle area.

10. The apparatus for processing of claim 6, wherein the etching machine comprises:

a bearing platform, configured to bear the semiconductor substrate having the photoresist layer;

a second spray nozzle, disposed opposite to the bearing platform; and a control assembly, electrically connected to the position detection assembly, and configured to receive the target etching area that is determined by the position detection assembly and control the second spray nozzle to spray an etching gas to the target etching area.

11. The apparatus for processing of claim 10, wherein the etching gas comprises an oxygen-containing gas.

12. The apparatus for processing of claim 11, wherein the oxygen-containing gas comprises at least one of oxygen, carbon monoxide, or carbon dioxide.

13. The apparatus for processing of claim 10, wherein the etching gas comprises hydrogen and nitrogen.

14. The apparatus for processing of claim 6, further comprising:

a gas concentration detection assembly, which extends into the vacuum chamber, and is configured to detect a gas concentration in the vacuum chamber and determine that the photoresist layer in the target etching area is etched completely in response to the gas concentration being less than a preset value.

15. A system for processing a semiconductor structure, comprising the apparatus for processing a semiconductor structure of claim 6; and a moving apparatus, configured to transport the semiconductor substrate from the spin-coating machine to the etching machine.

* * * * *